United States Patent
Chan et al.

(10) Patent No.: US 7,314,790 B2
(45) Date of Patent: Jan. 1, 2008

(54) ENHANCEMENT OF ELECTRON AND HOLE MOBILITIES IN <110> SI UNDER BIAXIAL COMPRESSIVE STRAIN

(75) Inventors: Victor Chan, New Paltz, NY (US); Massimo V. Fischetti, Putnam Valley, NY (US); John M. Hergenrother, Ridgefield, CT (US); Meikei Ieong, Wappingers Falls, NY (US); Rajesh Rengarajan, Fishkill, NY (US); Alexander Reznicek, Mount Kisco, NY (US); Paul M. Solomon, Yorktown Heights, NY (US); Chun-yung Sung, Poughkeepsie, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/612,309

(22) Filed: Dec. 18, 2006

(65) Prior Publication Data

US 2007/0099367 A1    May 3, 2007

Related U.S. Application Data

(62) Division of application No. 10/980,220, filed on Nov. 3, 2004, now Pat. No. 7,161,169.

(60) Provisional application No. 60/534,916, filed on Jan. 7, 2004.

(51) Int. Cl.
*H01L 21/336* (2006.01)
(52) U.S. Cl. .................... 438/198; 438/680; 257/18; 257/E21.102
(58) Field of Classification Search ................ 438/198
See application file for complete search history.

(56) References Cited

U.S. PATENT DOCUMENTS 4,282,543 A    8/1981    Ihara et al.

(Continued)

FOREIGN PATENT DOCUMENTS

WO    WO 03/105189 A    12/2003

OTHER PUBLICATIONS

Chan, Victor et al., "High Speed 45nm Gate Length CMOSFETs Integrated Into a 90nm Bulk Technology Incorporating Strain Engineering," IEEE, 2003.

*Primary Examiner*—Tu-Tu Ho
(74) *Attorney, Agent, or Firm*—Scully, Scott, Murphy & Presser, P.C.; Ido Tuchman, Esq.

(57) ABSTRACT

The present invention provides a semiconductor material that has enhanced electron and hole mobilities that comprises a Si-containing layer having a <110> crystal orientation and a biaxial compressive strain. The term "biaxial compressive stress" is used herein to describe the net stress caused by longitudinal compressive stress and lateral stress that is induced upon the Si-containing layer during the manufacturing of the semiconductor material. Other aspect of the present invention relates to a method of forming the semiconductor material of the present invention. The method of the present invention includes the steps of providing a silicon-containing <110> layer; and creating a biaxial strain in the silicon-containing <110> layer.

15 Claims, 12 Drawing Sheets

U.S. PATENT DOCUMENTS

| | | |
|---|---|---|
| 2002/0171104 A1 | 11/2002 | Cable et al. |
| 2003/0227036 A1 | 12/2003 | Naoharu et al. |
| 2004/0222090 A1 | 11/2004 | Scott et al. |
| 2004/0224480 A1 | 11/2004 | Forbes |
| 2005/0118754 A1 | 6/2005 | Henley |

| Compressive | NMOS | PMOS |
|---|---|---|
| longitudinal, X | ↓ | ↑ |
| lateral, Y | ↓ | ↓ |
| biaxial | ↑ | ↑ |

ENHANCEMENT OF ELECTRON AND HOLE MOBILITIES IN <110> SI UNDER BIAXIAL COMPRESSIVE STRAIN

RELATED APPLICATIONS

This application is a divisional of U.S. application Ser. No. 10/980,220, filed Nov. 3, 2004, now U.S. Pat. No. 7,161,169, which claims benefit of U.S. Provisional Application Ser. No. 60/534,916 filed Jan. 7, 2004, the entire contents of which are incorporated herein by reference.

FIELD OF THE INVENTION

The present invention relates to semiconductor materials having enhanced electron and hole mobilities, and more particularly, to semiconductor materials that include a silicon (Si)-containing layer having enhanced electron and hole mobilities. The present invention also provides various methods of forming such semiconductor materials.

BACKGROUND OF THE INVENTION

For more than three decades, the continued miniaturization of silicon metal oxide semiconductor field effect transistors (MOSFETs) has driven the worldwide semiconductor industry. Various showstoppers to continued scaling have been predicted for three decades, but a history of innovation has sustained Moore's Law in spite of many challenges. However, there are growing signs today that metal oxide semiconductor (MOS) transistors are beginning to reach their traditional scaling limits [A concise summary of near-term and long-term challenges to continued CMOS scaling can be found in the "Grand Challenges" section of the 2002 Update of the International Technology Roadmap for Semiconductors (ITRS). A very thorough review of the device, material, circuit, and systems limits can be found in Proc. IEEE, Vol. 89, No. 3, March 2001, a special issue dedicated to the limits of semiconductor technology].

Since it has become increasingly difficult to improve MOSFET and therefore complementary metal oxide semiconductor (CMOS) circuit performance through continued miniaturization, methods for improving performance without scaling have become critical. One general approach for doing this is to increase carrier (electron and/or hole) mobilities. This can by done by either: (1) introducing an appropriate strain into the Si lattice; (2) by building MOSFETs on Si surfaces that are oriented in directions different than the conventional <100> Si; or (3) a combination of (1) and (2).

As far as approach (1) is concerned, several methods such as, for example, strained Si on a relaxed SiGe buffer layer and strained Si on relaxed SiGe on insulator have been described for producing Si under biaxial tensile strain. This has been shown to significantly enhance electron mobilities, but requires high Ge fractions to only mildly enhance hole mobilities in <100> Si.

In terms of approach (2), it is well known that hole mobilities in <110> Si are more than twice that of conventional <100> Si. However, electron mobilities in relaxed (unstrained)<110> Si are degraded by about a factor of two compared to the <100> case. This has led to the invention of a somewhat complex t"hybrid" scheme for integrating pFETs built in <110> Si and nETs built in <100> Si [M. Yang et al., IEDM Technical Digest, pg. 453, 2003]. Although this hybrid approach benefits pFETs significantly, it typically has no benefit for nFETs.

There is a significant advantage to an approach that can significantly enhance both electron and hole mobilities, while at the same time avoiding the complexities of hybrid crystalline orientation schemes.

SUMMARY OF THE INVENTION

The present invention provides a semiconductor material that has enhanced carrier mobilities that comprises a Si-containing layer having a <110> crystal orientation that is under a biaxial compressive strain. The term "biaxial compressive strain" is used herein to describe the net stress caused by longitudinal compressive stress and lateral (or transverse) compressive stress that is induced in the plane of the Si-containing layer during the manufacturing of the semiconductor material.

The semiconductor material of the present invention that includes a <110> Si-containing layer with biaxial compressive strain provides enhanced mobilities for both nMOS and pMOS.

Another aspect of the present invention relates to a method of forming the semiconductor material of the present invention. Specifically and in broad terms, the method of the present invention includes the steps of providing a silicon-containing <110> layer; and creating a biaxial compressive strain in the silicon-containing <110> layer.

In one embodiment, the Si-containing layer having the <110> orientation and biaxial compressive strain is created by a method that includes the steps of:

forming at least one porous Si layer having an uppermost surface in a <110> Si-containing substrate;

annealing the uppermost surface so as to create a non-porous surface layer;

forming a crystalline epitaxial Si-containing layer having a <110> orientation on the non-porous surface layer thereby forming a transfer structure;

bonding the transfer structure to a material that has a higher coefficient of thermal expansion than Si at a temperature that is elevated above the ultimate device operating temperature to provide a bonded structure;

cooling the bonded structure so that a mechanically weak interface forms at said at least one porous Si layer thereby cleaving said bonded structure at said interface; and removing remaining portions of the least one porous Si layer from the cleaved structure to provide a semiconductor material that includes at least the crystalline epitaxial Si-containing layer having a <110> orientation atop said material, said crystalline epitaxial Si-containing layer is under biaxial compressive strain.

In another embodiment, the Si-containing layer having the <110> orientation and biaxial compressive strain is created by a method that includes the steps of:

forming at least one multiply connected trench isolation region in a surface of a Si-containing layer having a <110> crystal orientation; and forming at least one CMOS device on exposed portions of the Si-containing layer surrounded by said at least one multiply connected trench isolation region, wherein said at least one multiply connected trench isolation region creates biaxial compressive strain in said Si-containing layer In yet another embodiment of the present invention, the Si-containing layer having the <110> orientation and biaxial compressive strain is created by a method that includes the steps of:

providing a structure comprising a Si-containing layer having a <110> crystal orientation, said Si-containing layer having at least one CMOS device thereon; and forming a compressive liner on said structure, wherein said compressive liner causes said Si-containing layer to be under a biaxial compressive strain under the gate of the CMOS device.

In yet another embodiment of the present invention, the Si-containing layer having the <110> orientation and biaxial compressive strain is created by a method that includes the steps of:

forming at least one multiply connected trench isolation region in a surface of a Si-containing layer having a <110> crystal orientation;

forming at least one CMOS device on exposed portions of the Si-containing layer surrounded by said at least one multiply connected trench isolation region; and forming a compressive liner on said Si-containing layer, wherein said compressive liner and said least one multiply connected trench isolation region cause said Si-containing layer to be under a biaxial compressive strain.

For the at least one multiply connected trench isolation region and the compressive liner, the stress is primarily uniaxial when the devices are wide. As the width of the devices is reduced, the stress becomes biaxial.

BRIEF DESCRIPTION OF THE DRAWINGS

FIG. 6A is for nMOS devices, and FIG. 6B is for pMOS devices.

FIG. 7A is for nMOS devices, and FIG. 7B is for pMOS devices.

DETAILED DESCRIPTION OF THE INVENTION

Figure 1A:
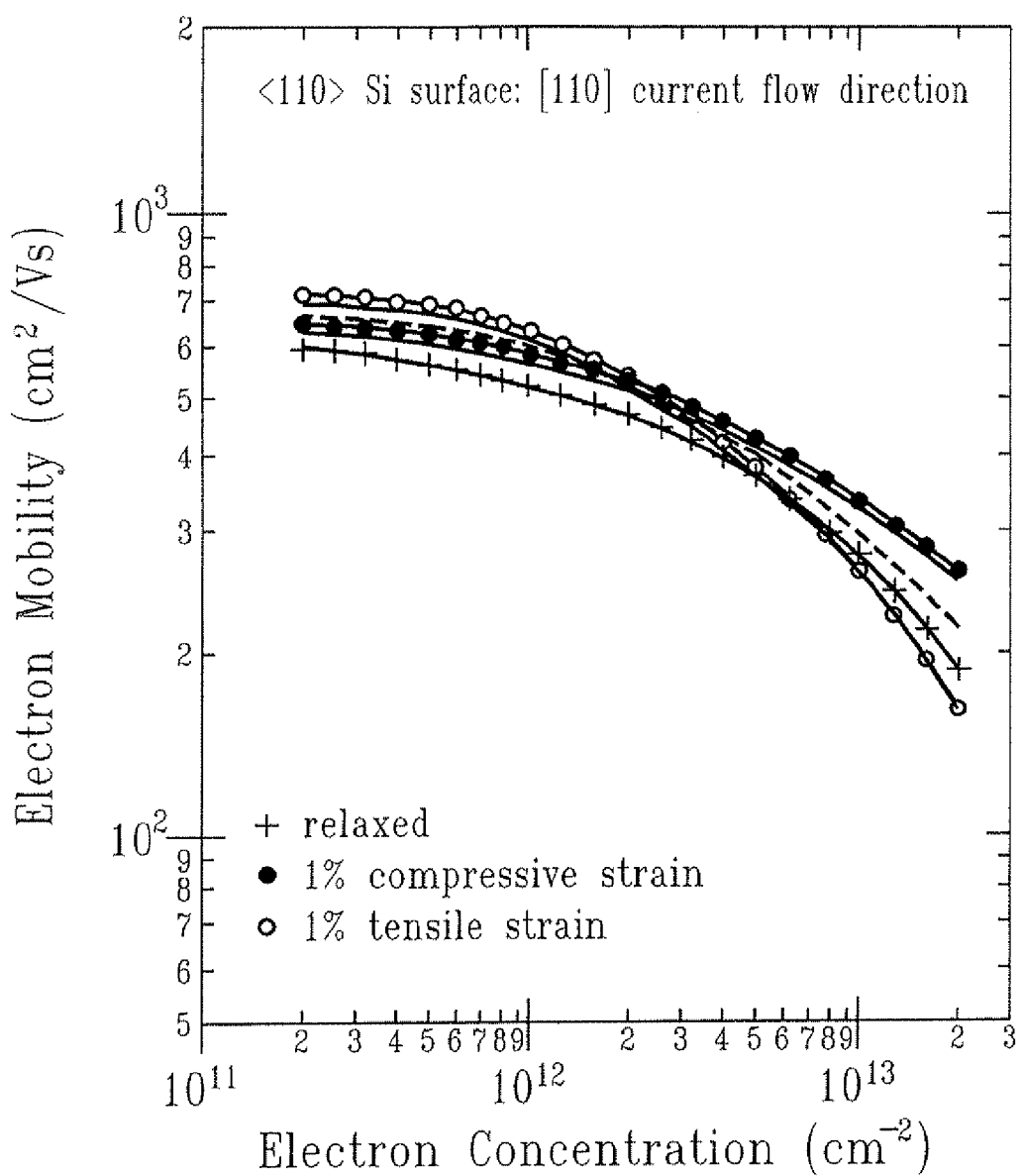
FIGS. 1A-1B are graphs of the electron mobility (cm$^2$/Vs) vs. electron concentration (cm$^{-2}$) for a <100> Si substrate having a conventional orientation and current flow direction (FIG. 1A), and for a Si substrate material having a <110> orientation with a 1% biaxial compressive strain (FIG. 1B); other strains are also shown.

The present invention, which provides a semiconductor material comprising a Si-containing layer having a <110> crystal orientation and biaxial compressive strain and various methods of forming the same, will now be described in greater detail by referring to the drawings that accompany the present application.

The applicants of the present application have determined through numerical calculations that when a significant (greater than about 0.2%, preferably greater than about 0.5%) biaxial compressive strain is introduced in a <110> Si-containing layer, both the electron and hole mobilities exceed those in the conventional unstrained <100> Si case. The % strain is defined herein as the percentage change in the crystalline lattice constant of a material in a given direction. The significant advantages of combining both biaxial compressive strain with a <110> Si-containing layer has not previously been recognized in the art.

The results of the above calculations, which have been determined by computing the carrier mobilities using the Kubo-Greenwood formula (which results from a solution of the linearized Boltzmann transport equation) for carriers in inversion layers is shown in FIGS. 1A-1B and FIGS. 2A-2B. The sub-band structure has been calculated using a model band structure consisting of six ellipsoidal conduction-band valleys (with first-order nonparabolic corrections following Kane) for nFETs, or by solving the six-band k*p Hamiltonian (3 bands times 2 spin states) with spin-orbit interaction for the pFETs. In the case of nFETs, the effect of strain has been accounted for by allowing for the known degeneracy-breaking and energetic shifts of the conduction ellipsoids and the (linear) changes of the effective masses. A full strain Hamiltonian has been added to the total (k*p+spin-orbit) Hamiltonian in the case of nFETs. The carrier momentum relaxation rates due to (intraband, intra- and inter-subband) scattering with acoustic phonons (in the elastic, equipartition approximation, valid for temperatures larger than about 150 K) and to inelastic, anisotropic scattering with optical phonons (intervalley for nFETs, intra- and interband for pFETS) have been evaluated numerically using Fermi Golden Rule and deformation potentials obtained from previous bulk calculations (M V Fischetti and S E Laux, J. Appl. Phys. 80, 2234 (1996)). Scattering with roughness at the Si—SiO$_2$ interface has been treated according to the full Ando's model and using a rigorous multi-subband model for dielectric screening.

FIG. 1A shows the calculated electron mobility in the inversion layer of nFETs (as a function of carrier sheet density) for a more common Si <100> wafer surface along the [110] crystallographic direction, usually employed in present VLSI technology. The application of 1% biaxial tensile strain shows the well-known enhancement of the electron mobility at low electron densities. By contrast, FIG. 1B shows that even moderate amounts of compressive strain (0.5% or larger) for <110> surfaces boosts the electron mobility (along the [110] direction) above and beyond the values attained at all densities for the relaxed or strained <100> surface.

Figure 1B:
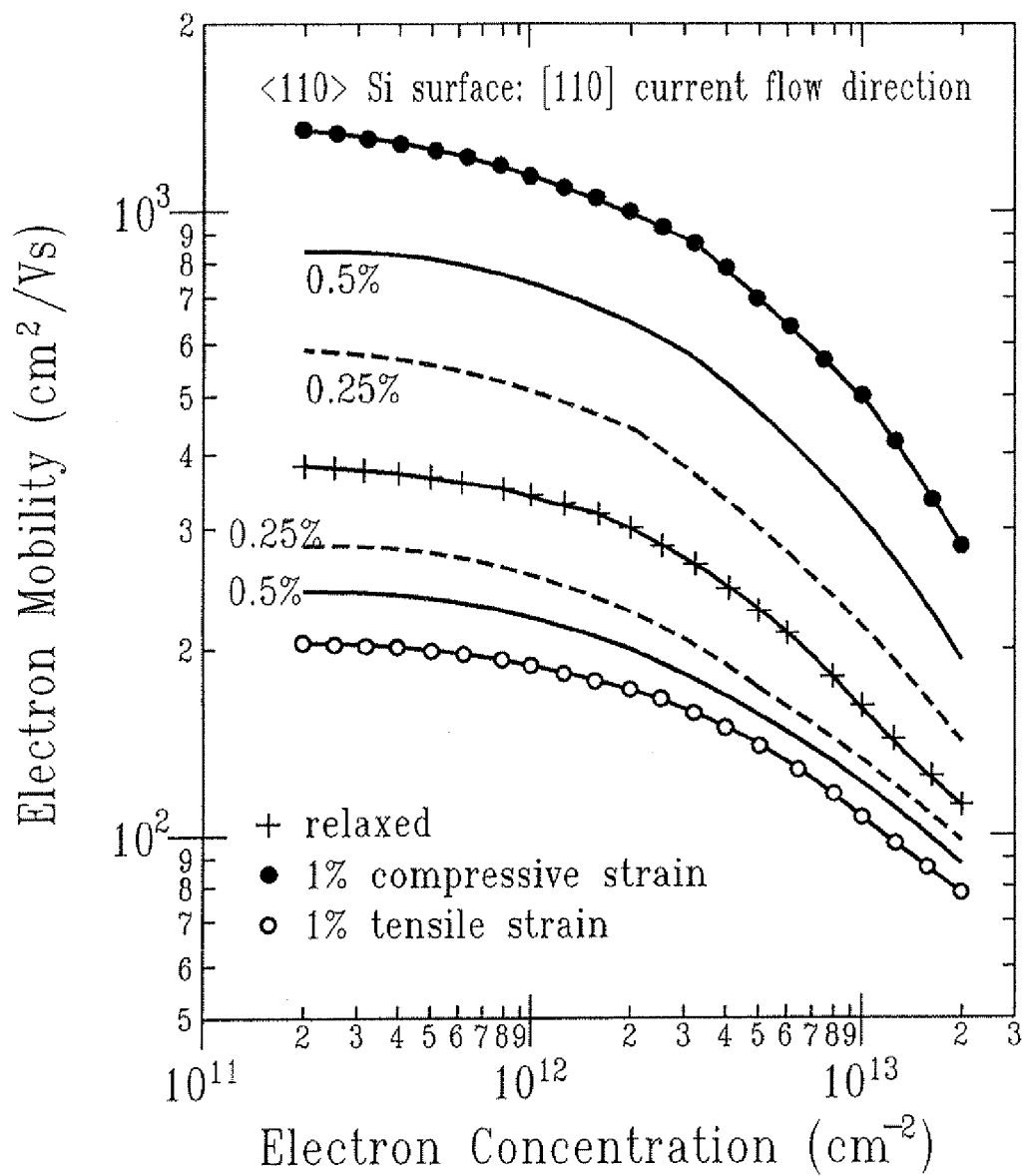

As shown by comparing FIG. 1A and FIG. 1B, the application of 1% compressive strain on <110> Si surfaces enhances the electron mobility by a factor of approximately 2 above the mobility obtained for <100> relaxed (or with 1% compressive or tensile strain) Si.

Figure 2A:
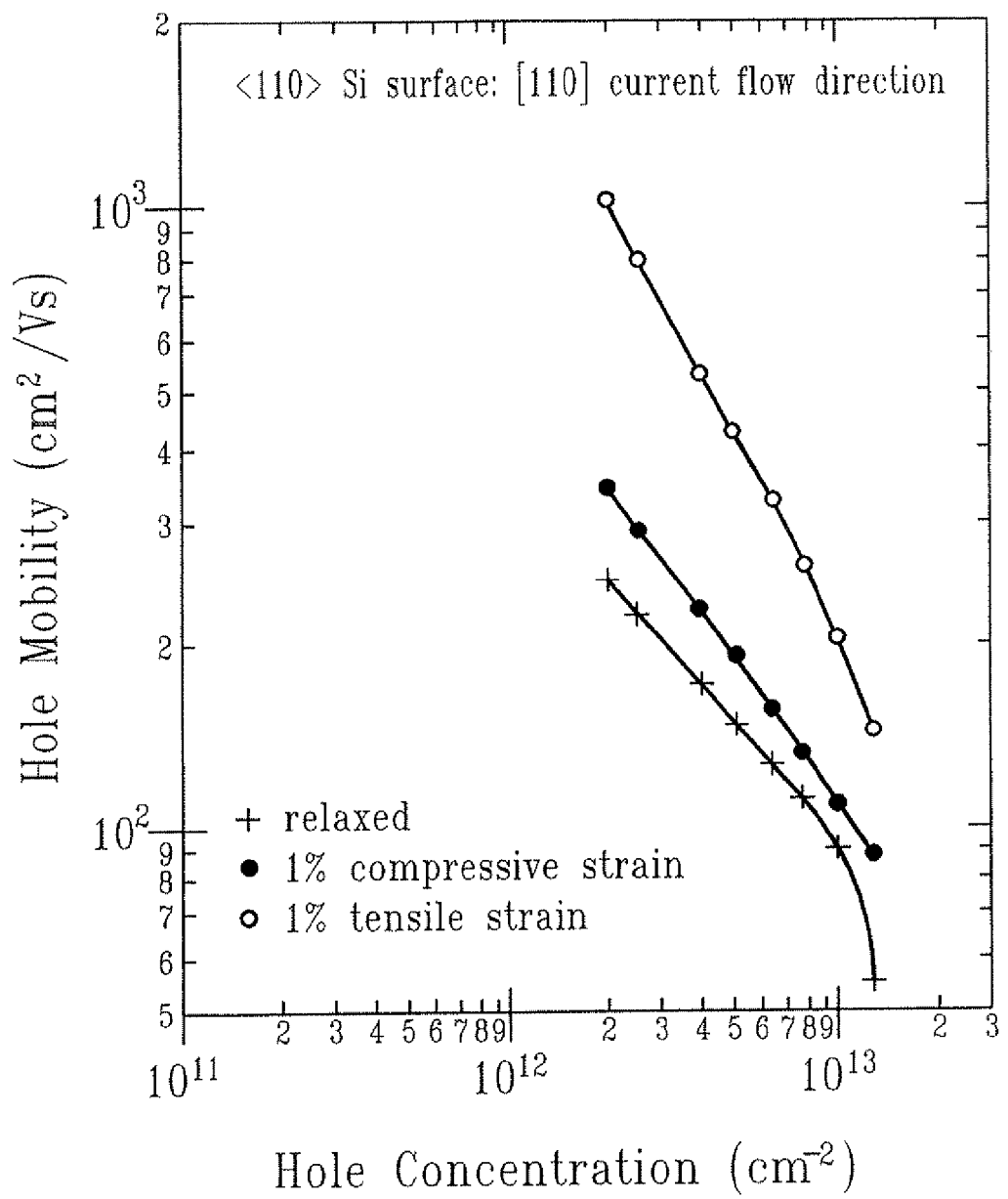
FIGS. 2A-2B are graphs of the hole mobility (cm$^2$/Vs) vs. hole concentration (cm$^{-2}$) for a <100> Si substrate having a conventional orientation and current flow direction (FIG. 2A), and for a Si substrate material having a <110> orientation with a 1% biaxial compressive strain (FIG. 2B); other strains are also shown.
Figure 2B:
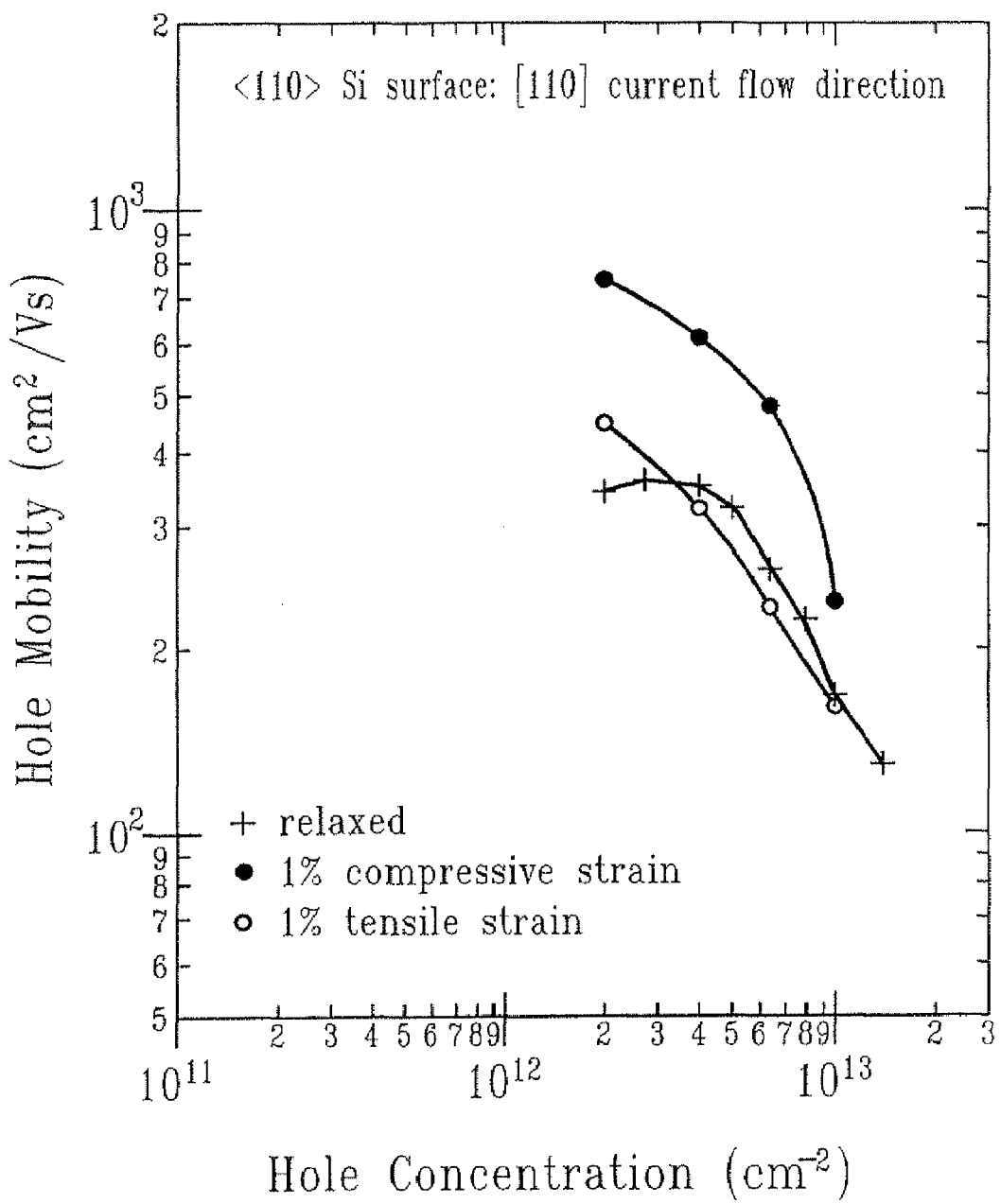

FIGS. 2A-2B present analogous information regarding the calculated hole mobility for <100> (FIG. 2A) and <110> (FIG. 2B) Si surfaces. As can be seen in these drawings, the application of 1% compressive strain on <110> surfaces boosts the hole mobility along the [110] direction by a factor of approximately 3 over the hole mobility for the relaxed <100> Si surface.

These enhanced mobilities obtained using the inventive Si substrate simultaneously enable higher performance nFETs and pFETs, and avoid the complexities of a hybrid crystalline orientation approach. The following description, with reference to FIGS. 3A-3E illustrate one method that can be employed in the present invention through which a biaxial compressive strain (greater than about 0.2%, preferably greater than about 0.5%) can be introduced into a <110> Si-containing layer in order to achieve these significantly higher carrier mobilities.

Figure 3A:
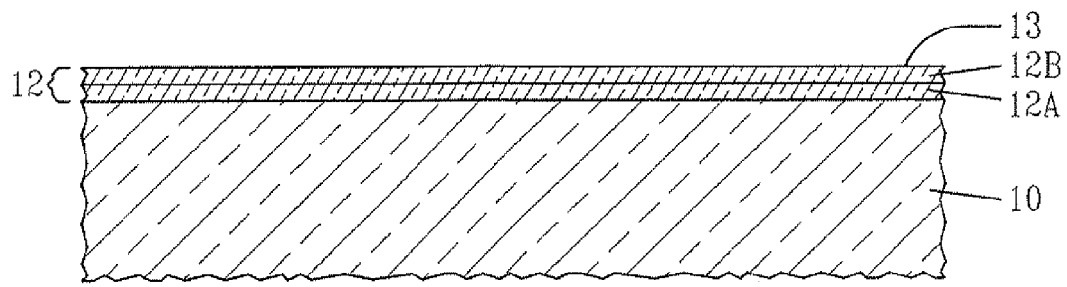
FIGS. 3A-3E are pictorial representations (through cross sectional views) illustrating the basic processing steps employed in a first embodiment of the present invention.

FIG. 3A illustrates an initial structure that can be used in forming the inventive substrate material of the present invention. Specifically, the initial structure shown in FIG. 3A includes a <110> Si-containing substrate 10 having at least one porous Si layer 12 formed on the surface of Si-containing substrate 10. The at least one porous Si layer 12 has an uppermost surface layer 13. In the drawings, two porous Si layers 12A and 12B are formed. Despite showing the presence of two porous Si layers 12A and 12B, the present invention works equally well when only one porous Si layer or more than two porous Si layers are formed.

The term "Si-containing substrate" is used in the present invention to denote a semiconductor material that includes Si. Illustrative examples of such Si-containing materials that can be employed as substrate 10 include bulk Si, SiGe having a Ge content of about 25% or less, silicon-on-insulators (SOIs) and SiGe-on-insulators. The substrates can be doped or undoped.

The at least one porous Si layer is formed in the present invention by utilizing an electrolytic anodization process that is capable of converting a surface portion of the <110> Si-containing substrate 10 into a porous Si layer. The anodization process is performed by immersing the <110> Si-containing substrate 10 into an HF-containing solution while an electrical bias is applied to the <110> Si-containing substrate 10 with respect to an electrode also placed in the HF-containing solution. In such a process, the <110> Si-containing substrate 10 itself typically serves as the positive electrode of the electrochemical cell, while another semiconducting material such as Si, or a metal is employed as the negative electrode.

The anodization process used in forming the porous Si layers can also be referred to as an anodic etching process. The porous Si layers created using the anodization process are mechanically weak as compared to the remainder of the Si-containing substrate 10, yet the porous Si layers preserve the crystalline quality and orientation of the Si-containing substrate 10.

It should be noted that when more than one porous Si layer 12 is formed, the other porous layers can have the same or different pore morphology. Porous Si layers containing different pore morphologies can be formed in the present invention by changing the current flow conditions during the anodization process.

In general, the HF anodization converts a surface region of the Si-containing substrate 10 into porous Si. The rate of formation and the nature of the porous Si so-formed (porosity and microstracture) are determined by both the material properties as well as the reaction conditions of the anodization process itself (current density, bias, illumination and additives in the HF-containing solution). Generally, the porous Si layers 12A and 12B formed in the present invention have a porosity of about 0.1% or higher.

The thickness of each porous Si layer 12 may vary depending on the anodization conditions employed. Typically, the thickness of each porous Si layer 12 formed in the present invention is from about 100 nm to about several microns, with a thickness from about 300 to about 500 nm being more typical. Each porous Si layer 12 may have the same or different thickness that is within the ranges mentioned above.

The term "HF-containing solution" includes concentrated HF (49%), a mixture of HF and water, a mixture of HF and a monohydric alcohol such as methanol, ethanol, propanol, etc, or HF mixed with at least one conventional surfactant. The amount of surfactant that is present in the HF solution is typically from about 1 to about 50%, based on 49% HF.

The anodization process is performed using a constant current source that operates at a current density from about 0.05 to about 50 milliAmps/cm$^2$. A light source may be optionally used to illuminate the sample. More preferably, the anodization process of the present invention is employed using a constant current source operating at a current density from about 0.1 to about 5 milliAmps/cm$^2$.

The anodization process is typically performed at room temperature or at a temperature that is slightly elevated from room temperature may be used. Following the anodization process, the structure is typically rinsed with deionized water and dried.

Following the anodization process in which at least one porous Si layer 12 is formed in the <110> Si-containing substrate 10, the structure shown in FIG. 3A is subjected to an annealing process that is performed under conditions (temperature and ambient) that are effective in sealing the pores at the uppermost porous Si layer. In the present case shown, the annealing step would seal the pores at the surface of porous Si layer 12B. The annealing step performed at this point of the present invention causes surface diffusion of silicon atoms thereby creating a thin skin of non-porous Si. The thin skin of non-porous Si is designated by reference numeral 14 in FIG. 3B. The skin layer of non-porous Si formed at this point of the present invention generally has a thickness from about 5 to about 80 nm, with a thickness from about 10 to about 30 nm being more typical.

The annealing step that is used to seal the pores of the uppermost porous Si layer 13 is performed at high annealing temperatures. By "high annealing temperatures" it is meant annealing temperatures from about 900° to about 1150° C. More preferably, the annealing step is performed at a temperature from about 1000° to about 1100° C. The annealing may be performed using a single ramp up rate. Alternatively, the annealing may be performed using varies ramp-up rates in which optional soak cycles can be employed.

In addition to being performed at high temperatures, the annealing step of the present invention, which is used to seal the pores of the uppermost porous Si layer 13, is also performed in the presence of a hydrogen-containing ambient Suitable hydrogen-containing ambient that can be employed includes molecular or atomic hydrogen. In some embodiments, the hydrogen-containing ambient may be admixed with an inert gas such as He, Ar, N$_2$ or Xe. In some preferred embodiments of the present invention, the annealing ambient is H$_2$.

After sealing the pores at the top of the porous Si layer using the aforementioned high temperature annealing step, an epitaxial layer of a Si-containing material, i.e., Si or SiGe, is formed on the thin skinned Si layer 14. The epitaxial Si-containing layer is a crystalline material that has the same crystal orientation as that of the substrate 10, The epitaxial Si-containing layer is formed by employing an epitaxial growth process that is well known to those skilled in the art. For example, the epitaxial Si-containing layer can be formed by an ultra-high vacuum chemical vapor deposition (UH-VCVD) process or any other like technique.

Figure 3B:
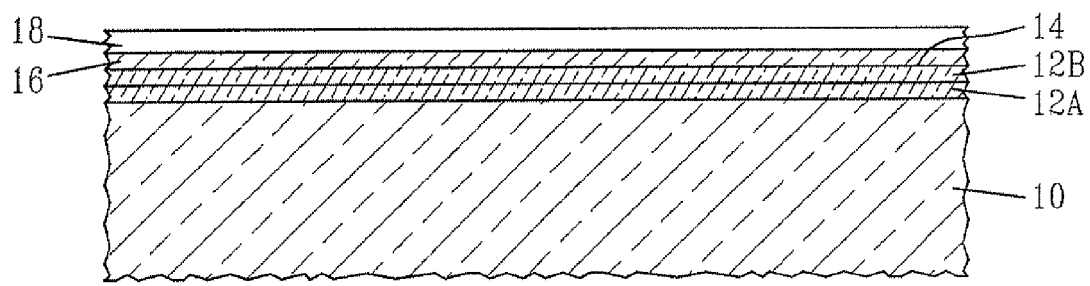

The epitaxial Si-containing layer formed atop the thin skinned non-porous Si surface 14 is designed in FIG. 3B by reference numeral 16. The thickness of the epitaxial Si-containing layer 16 formed at this point of the present invention may vary depending on the process used in forming the same. Typically, the epitaxial Si-containing layer 16 has a thickness from about 10 to about 100 nm, with a thickness from about 10 to about 30 nm being more typical.

It is noted that the above discussion regarding Si formation, pore sealing and epi growth is well known to one skilled in the art. The above processing steps are based on the well-known ELTRAN process for SOI wafer manufacture (see T. Yonehara and K. Sakaguchi, "ELTRAN (SOI Epi Wafer) Technology," in The Science of SOI, Chapter 2, Section 2, (Apr. 19, 2000).

In some embodiments of the present invention, an optional oxide layer 18 (see FIG. 3B) can be formed on the epitaxial Si-containing layer 16. The optional oxide layer 18 can be formed by a conventional oxidation process. Alternatively, the optional oxide layer 18 can be formed by a conventional deposition process such as chemical vapor deposition (CVD), plasma-enhanced chemical vapor deposition (PECVD), atomic layer deposition (ALD), chemical solution deposition, and the like.

The thickness of the optional oxide layer 18 formed at this point of the present invention may vary depending on the process used in forming the same. Typically, the optional oxide layer 18 has a thickness from about 10 to about 200 nm, with a thickness from about 20 to about 100 nm being more typical.

Figure 3C:
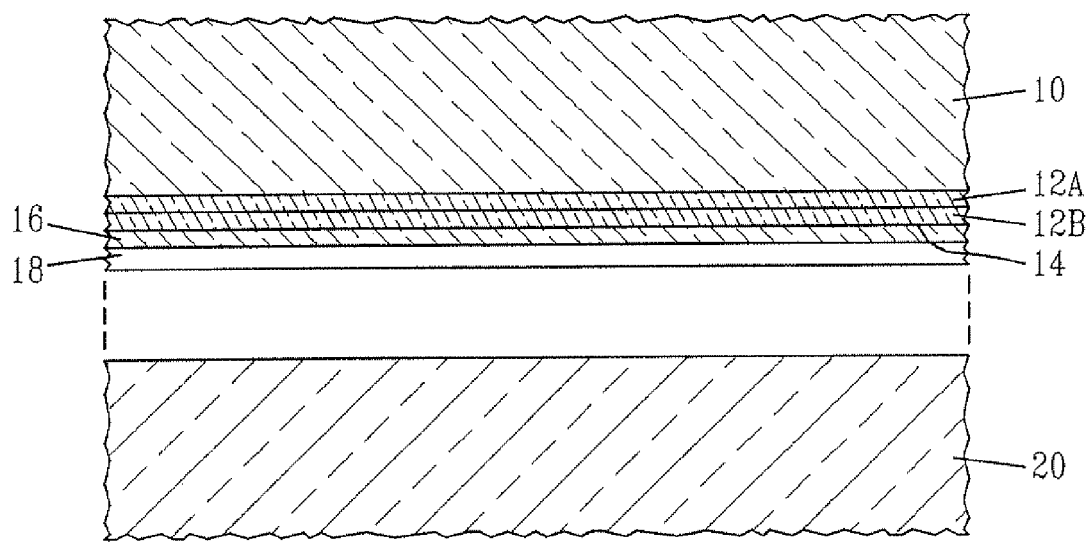

The structure shown in FIG. 3B, with or without the optional oxide layer 18, is employed in the present invention as a transfer structure that will be bonded to a substrate 20 at elevated temperature. FIG. 3C shows substrate 20 which can be bonded to the optional oxide layer 18 or the epitaxial Si-containing layer 16 of the transfer structure. This bonding is achieved by first positioning the two structures as shown in FIG. 3C, bringing them in contact with each other, optionally applying an external force to the contacted structures, and heating the two structures.

The substrate 20 that can be employed in the present invention includes any material that has a coefficient of thermal expansion that is significantly greater than the Si-containing substrate 10. That is, substrate 20 includes any material having a coefficient of thermal expansion a that is significantly greater than about 2.8 ppm/° C. Illustrative examples of suitable materials for substrate 20 include sapphire ($\alpha$=8.8 ppm/° C.), germanium ($\alpha$=5.8 ppm/° C. at room temperature, which increased significantly with temperature) and calcium fluoride ($\alpha$=19 ppm/° C.).

In some embodiments not shown, an optional oxide layer can be formed on the surface of the substrate 20 prior to bonding. This optional oxide layer can be formed as described above and it alone or together with the optional oxide layer 18 of the transfer structure can be used to facilitate wafer bonding.

The heating step used to bond the two structures together is performed at an elevated temperature that ranges from about 400° to about 1000° C. More preferably, the bonding is performed at a temperature from about 750° to about 925° C. The heating step can be performed using a single ramp-up rate or various ramp-up rates with optional soaking cycles can be employed. In some embodiments, the heating step used to bond the two structures together can be performed in an inert ambient including, for example, He, Ar, $N_2$, Xe and mixtures therefore. Other ambients can be also used in bonding the two structures together.

Upon cooling down from the high wafer bonding temperature, substrate 20 will contract more than Si-containing substrate 10 due to its higher coefficient of thermal expansion. This will create significant compressive stress in the Si-containing layer 16 above the optional oxide layer 18 (which will remain rigid at these temperatures) and in the porous Si layers. The cooling down is typically performed using a cool down rate of about 50° C./min or less.

Figure 3D:
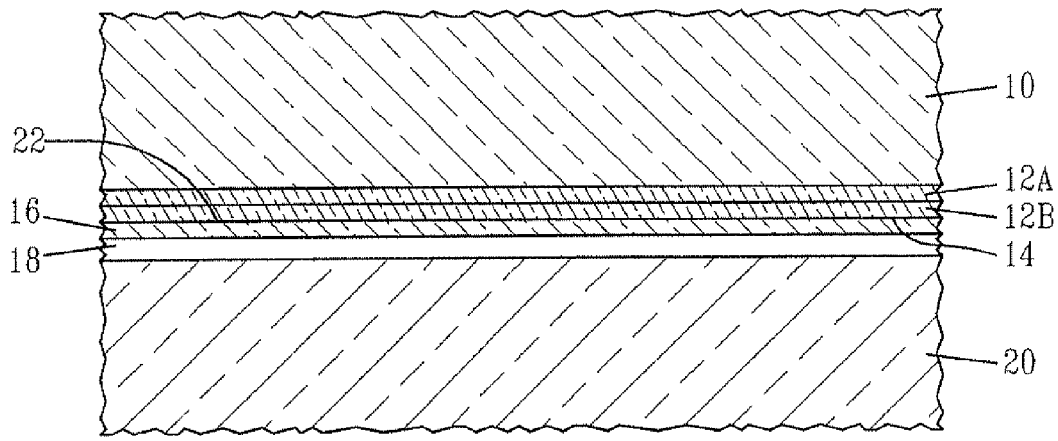

Due to the considerable interfacial stress at the boundary between the porous layers, the bonded wafer will preferentially cleave along the interface of the two porous layers. In FIG. 3D, reference numeral 22 denotes the interface in which cleavage occurs. With one porous layer, the cleavage will occur within the porous layer or at the edge or the porous layer. Without the porous Si layer, either substrate 20 or the Si-containing substrate 10 will fracture due to the strong bonding and the mismatch in coefficients of thermal expansion. This cleavage is well-known to one skilled in the art of ELTRAN wafer fabrication.

Due to its extremely high surface-to-volume ratio, the remaining porous Si layer(s) can be removed with high selectivity (greater than 1000:1) to the epitaxial Si-containing layer 16 utilizing a wet etching process. In particular, the remaining porous Si layer not cleaved during the cool down process can be removed using a wet etch process in which the chemical etchant is a solution of hydrofluoric acid, nitric acid and acetic acid. Other chemical etchants that can be employed in selectively removing the remaining porous layers include a mixture of HF, $H_2O_2$, and $H_2O$. The selective removing of the remaining porous Si layers exposes a surface of epitaxial Si-containing layer 16.

Figure 3E:
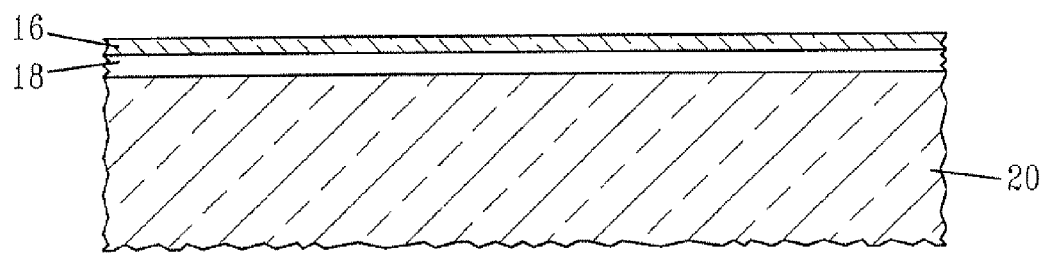

FIG. 3E shows the structure that is formed after cleaving and removing of the remaining porous Si layers. The structure shown in FIG. 3E includes substrate 20, optional oxide layer 18 and epitaxial Si-containing layer 16 having a <110> orientation that is under biaxial compressive strain. It is noted that the structure shown in FIG. 3E is an SOI like structure since the epitaxial Si-containing <110> layer 16 is located directly upon an insulator, e.g., oxide layer 18.

The newly exposed Si-containing surface of layer 16 can be smoothed at this point of the present invention utilizing an annealing process that is carried out in an $H_2$-containing ambient. This annealing step is performed at a temperature from about 850° to about 1100° C., with a temperature from about 900° to about 950° being more preferred. Care should be taken during this annealing step so as not to relax the compressively strained Si-containing layer 16 by flowing the oxide 18 with an excessive (>1100° C.) thermal treatment. Chemical mechanical polishing (CMP) can also be used.

The thin Si-containing layer 16 is analogous to that formed in strained Si directly on insulator (SSDOI) but with a strain of the opposite sign. The device scaling advantages that can be derived from the thin nature of Si-containing layer 16 would be similar to that of SSDOI, but with the potential for even higher carrier mobility enhancements due to the sign of the strained and the orientation of the wafer.

In embodiments in which the optional oxide layer 18 is not present, the thin Si-containing layer 16 would be formed directly upon substrate 20. Note that since layer 16 is epitaxially grown it has the same crystallographic orientation as substrate 10 which is <110>. In the embodiment in which substrate 20 is sapphire, the method of the present invention can lead to a biaxial compressive strain up to 0.6%. In embodiments in which substrate 20 is calcium fluoride, the method of the present invention can lead to a biaxial compressive strain up to 1.0%. When calcium fluoride is employed as substrate 20, care must be taken to minimize exposure to water vapor at elevated temperatures of greater than about 600° C.

After forming the structure shown in FIG. 3E, various CMOS devices, including nFETS, pFETs and a combination thereof, can be formed directly on the Si-containing layer 16. The CMOS devices are formed utilizing conventional processes that are well known to those skilled in the art.

In addition to the wafer transfer technique described above in FIGS. 3A-3E, the present invention also contemplates an embodiment for forming a semiconductor material having a <110> Si-containing layer that is under biaxial compressive strain wherein at least one multiply connected trench isolation region, a compressive liner or both are used to create the strain in the Si-containing layer.

Figure 4A:
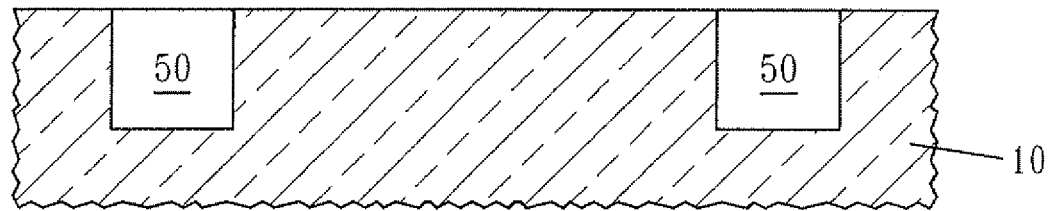
FIGS. 4A-4C are pictorial representations (through cross sectional views) illustrating the basic processing steps employed in an embodiment of the present invention in which both an at least one multiply connected trench isolation region and a compressive liner are employed to create strain in a Si-containing layer, note that the <110> direction is perpendicular to the Si-containing substrate shown.
Figure 4B:
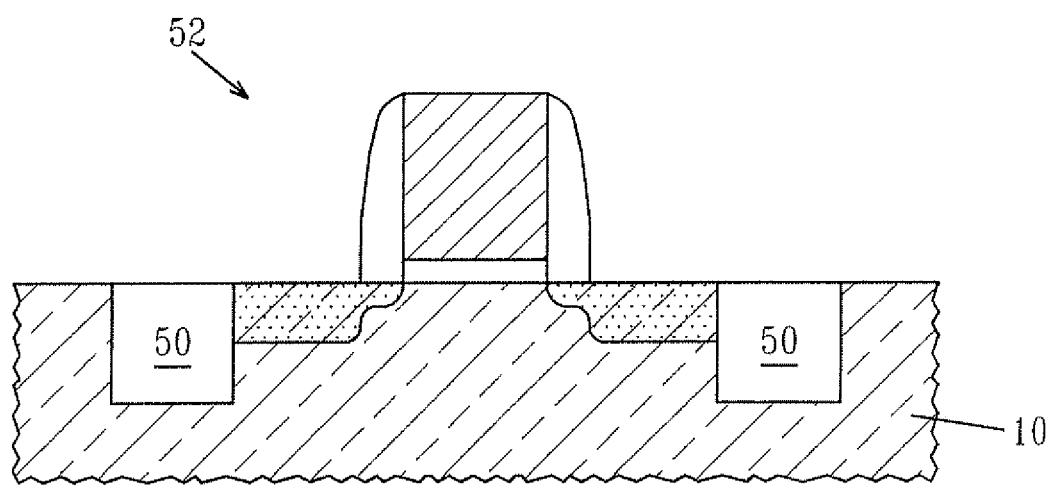
Figures 4C, 5:
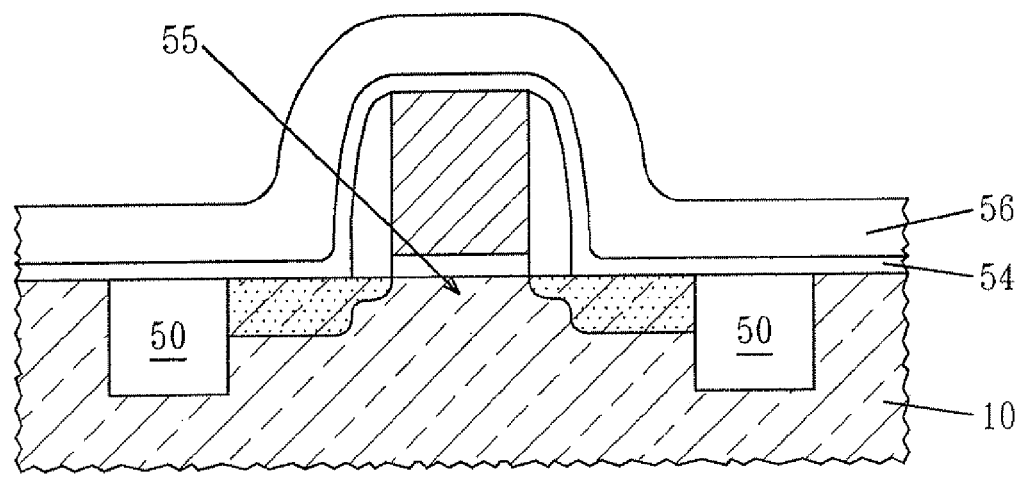
FIG. 5 shows the strain effect on CMOS performance.

FIGS. 4A-4C show the embodiment in which both the at least one multiply connected trench isolation region and a compressive liner are used to create the strain in a Si-containing layer. The compressive liner is formed after isolation trench formation and formation of the CMOS devices on the surface of the Si-containing layer or substrate 10.

This embodiment of the present invention begins by first providing a Si-containing substrate or layer 10 having a <110> crystal orientation and then forming at least one multiply connected trench isolation region 50 in layer 10. Herein after the at least one multiply connected trench isolation region is referred to as just isolation trench region. The term "multiply connected" means that the isolation regions have holes therein. The isolation trench regions 50 are formed by first forming a hardmask (not shown) on the surface of the substrate 10. The hardmask typically comprises a nitride layer on top of a thin oxide layer. The hardmask can be formed by a thermal growth process or deposition, both of which are well known to those skilled in the art. The thickness of the hardmask layer can vary depending on the material and technique used in forming the same. Typically, the hardmask has a thickness from about 30 to about 100 nm.

Following formation of the hardmask, a patterned photoresist (not shown) having at least one multiply connected trench is formed by deposition and lithography. The at least one trench pattern is then transferred to the hardmask layer by a conventional etching process. Following the pattern transfer, the patterned photoresist is typically removed from the structure by a conventional stripping process and then the trench pattern formed into the hardmask is transferred to the substrate 10 via another etching process. This etching step forms a trench into the substrate 10. Alternatively, a single etch sequence can be used to pattern the hardmask and form the trench into the substrate. The depth of the trench, as measured from the upper surface of the substrate 10 to the bottom of the trench, is typically from about 50 to about 500 nm.

Following pattern transfer to the substrate 10, an optional trench liner (not shown) is formed so as to line the walls of the trench and thereafter the trench is filled by a conventional deposition process with a trench dielectric material including for example an oxide. After the trench fill step, the trench dielectric above the trench is typically removed via a planarization process and then the hardmask is removed.

A densification step is typically conducted prior to planarization and hardmask removal. Typically, this is a long (hour-long) anneal at high temperatures (900°-1100° C.) in an $N_2$ ambient. This essentially drives off the hydrogen in the oxide material.

The structure that is formed after the above steps have been performed is shown in FIG. 4A. At this point of the present invention, at least one CMOS device represented by reference numeral 52 can be formed on the exposed surface of the substrate 10 by utilizing a conventional CMOS process. See, for example, the structure shown in FIG. 4B.

Following CMOS device fabrication, a compressive liner 54 is formed on the exposed surfaces of at least the substrate 10. The compressive liner is typically comprised of a nitride-containing material. Although nitride-containing materials are typically used, other insulating materials that can induced biaxial stress to the Si-containing substrate 10 can be used. The compressive liner 54 is formed by a utilizing a deposition process such as PECVD or RTCVD. The thickness of the compressive liner 54 can vary depending on the conditions used in forming the same. Typically, the compressive liner 54 has thickness from about 20 to about 100 nm. The compressive liner 54 formed at this point of the present invention introduces compressive stress into the region under the gate of the device. (see Region 55).

Following formation of the compressive liner 54, oxide layer 56 is formed by a deposition process such as PECVD. The thickness of oxide layer 56 can vary depending on the conditions used in forming the same. Typically, the oxide layer 56 has a thickness from about 200 to about 1000 nm. This oxide layer is then planarized using CMP. FIG. 4C shows the resultant structure that is formed after formation of the compressive liner 54 and oxide layer 56.

In this embodiment of the present invention, the trench isolation regions 50 produce compressive stress longitudinally towards the channel (and also laterally for narrow devices), The compressive stress in the channel will be higher for shorter source/drain overhang regions. Different types of nitride liners with different stress can modulate the local stress of the channel.

It is again emphasized that although FIGS. 4A-4C show the presence of both the at least one multiply connected trench isolation region and the compressive liner to create the biaxial compressive strain in the Si-containing layer, the strain can also be created using only the at least one multiply connected trench isolation region or the compressive liner.

It has been determined by the present applicants that the current will have slightly more degradation on a <100> orientated wafer than a <110> oriented wafer for nMOS devices, and more enhancement on the <100> oriented wafer than a <110> oriented wafer for a pMOS. The sensitivity of the current change is not high on the nMOS with different nitride liner stress, but is higher on the pMOS.

When the device becomes narrower, the channel will receive compressive stress from the trench isolation region in the lateral direction. FIG. 5 shows that both nMOS and pMOS drive current will be degraded. Devices on (100) wafers will have larger degradation.

Figure 6A:
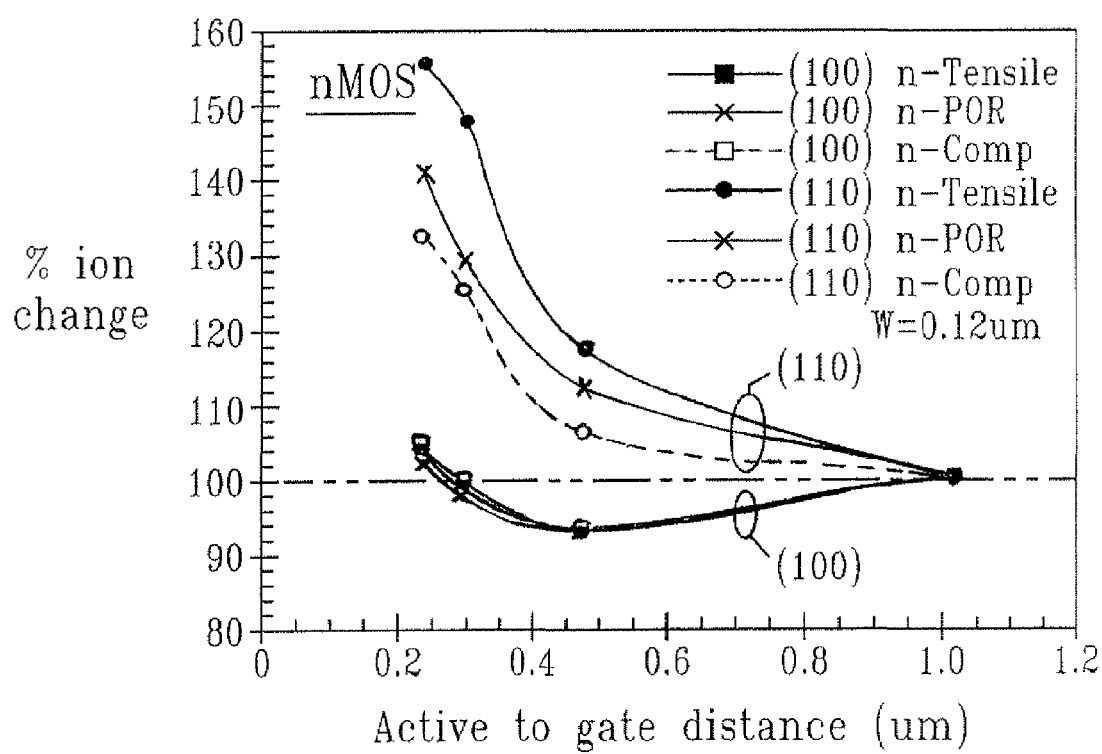
FIGS. 6A-6B are graphs illustrating the STI mechanical stress effect on drive current with different crystal orientation and different nitride liner stress. All the devices have narrow widths (120 nm) and nominal (45 nm) length.
Figure 6B:
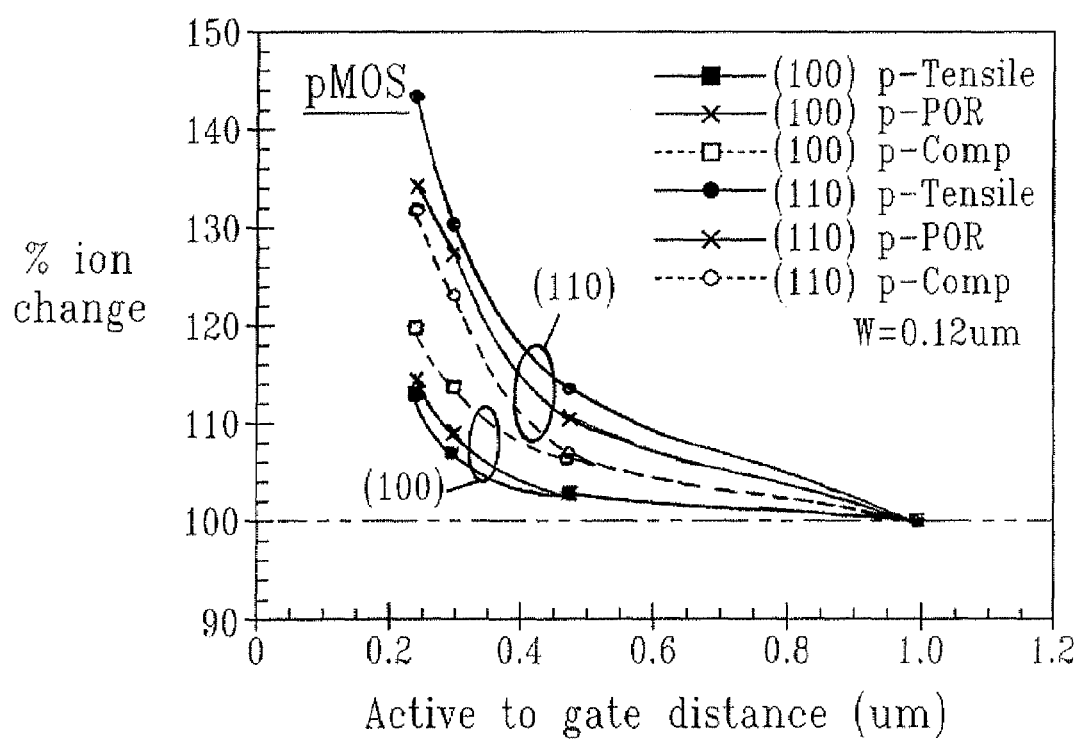
Figure 7A:
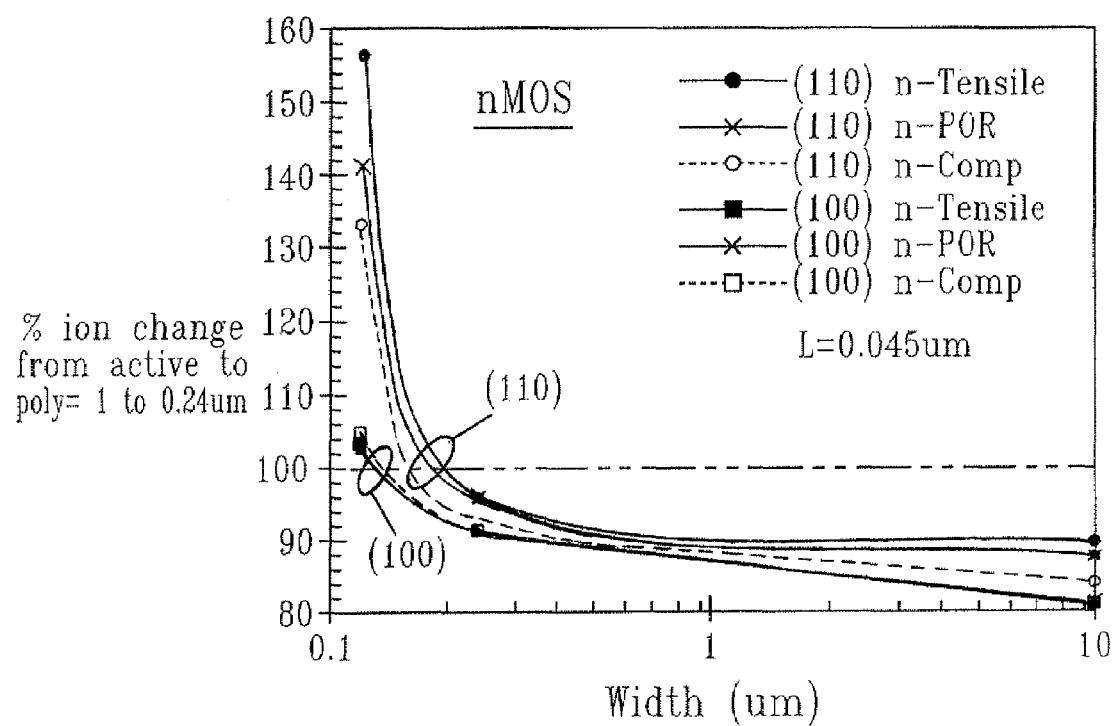
FIGS. 7A-7B are graphs illustrating the STI mechanical stress effect of devices with different widths, different crystal orientation and different nitride liner stress.
Figure 7B:
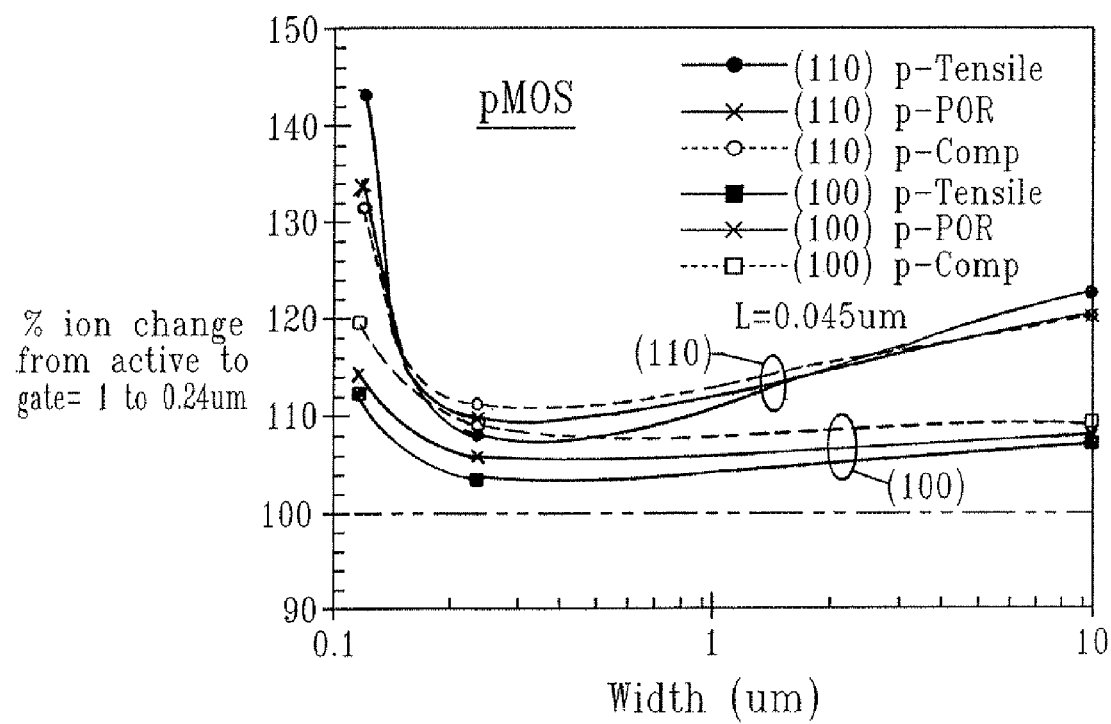

When the narrow device has small S/D overhang region, the channel will receive compressive stress in both lateral and longitudinal directions. FIGS. 6A-6B show the change of saturation current of narrow width devices. For devices on (100) surface, the nMOS current will be degraded by a large S/D overhang region and improved by a smaller S/D overhang region. This threshold region from mobility degradation to improvement indicates the effect from uni-axial to biaxial stress effect. Devices on (110) wafers have higher sensitivity than those on (110) wafers, and the improvement can be as high as 155%. This suggests that the longitudinal compressive stress plus the lateral stress, or simply biaxial compressive stress, can enhance the nMOS current. The nitride liner can also modulate the biaxial stress effect and is more effective on the devices built on the (110) wafer and narrow width devices (FIGS. 7A-7B). FIGS. 7A-7B show that nMOS has current improvement instead of degradation with small S/D overhang region when the width is narrower than 0.2 mm. Similarly, pMOS will have higher mobility change for narrower width devices compared to long width devices. Both uni-axial longitudinal and biaxial stress can improve pMOS performance.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for forming a silicon-containing semiconductor material comprising the steps of:
    providing a silicon-containing <110> layer; and
    creating a biaxial compressive strain in said silicon-containing <110> layer, wherein said creating a biaxial compressive strain comprises forming at least one porous Si layer having an uppermost surface in said <110> Si-containing layer; annealing the uppermost surface to create a non-porous surface layer; forming a crystalline epitaxial Si-containing layer having a <110> orientation on the non-porous surface layer thereby forming a transfer structure; bonding the transfer structure to a material that has a higher coefficient of thermal expansion than Si at a temperature that is elevated above the ultimate device operating temperature to provide a bonded structure; cooling the bonded structure so that a mechanically weak interface forms at said at least one porous Si layer thereby cleaving said bonded structure at said interface; and removing remaining portions of the least one porous Si layer from the cleaved structure.

2. The method of claim 1 wherein forming said at least one porous Si layer comprises an electrolytic anodization process.

3. The method of claim 2 wherein said anodization process includes utilizing an HF-containing solution.

4. The method of claim 1 wherein said annealing is performed at a temperature from about 900° to about 1150° C.

5. The method of claim 1 wherein said forming said crystalline epitaxial Si-containing layer comprises an epitaxial growth process.

6. The method of claim 5 wherein said epitaxial growth process comprises an UHVCVD process.

7. The method of claim 1 further comprising forming an oxide layer on said crystalline Si-containing layer prior to bonding.

8. The method of claim 1 wherein said bonding comprises bringing that transfer structure and said material together, optionally applying an external force, and heating.

9. The method of claim 8 wherein said heating is performed at a temperature from about 400° to about 1000° C.

10. The method of claim 1 wherein said cooling is performed at a rate of about 50° C./min or less.

11. The method of claim 1 wherein said removing comprises a wet etching process.

12. The method of claim 1 further comprising smoothing said crystalline epitaxial Si-containing that is under biaxial compressive strain by annealing in a $H_2$-containing ambient at a temperature of from about 850° to about 1100° C.

13. The method of claim 1 wherein said creating a biaxial compressive strain further comprises forming at least one CMOS device on said Si-containing layer, and forming a compressive liner on exposed surfaces of said CMOS device and said Si-containing layer.

14. The method of claim 13 wherein said compressive liner comprises a nitride-containing material.

15. A method for forming a silicon-containing semiconductor material comprising the steps of:
    forming at least one porous Si layer having an uppermost surface in a <110> Si-containing substrate;
    annealing the uppermost surface to create a non-porous surface layer;
    forming a crystalline epitaxial Si-containing layer having a <110> orientation on the non-porous surface layer thereby forming a transfer structure;
    bonding the transfer structure to a material that has a higher coefficient of thermal expansion than Si at a temperature that is elevated above the ultimate device operating temperature to provide a bonded structure;
    cooling the bonded structure so that a mechanically weak interface forms at said at least one porous Si layer thereby cleaving said bonded structure at said interface; and
    removing remaining portions of the least one porous Si layer from the cleaved structure so as to provide a semiconductor material that includes at least the crystalline epitaxial Si-containing layer having a <110> orientation atop said material, said crystalline epitaxial Si-containing layer is under biaxial compressive strain.

* * * * *